Dec. 8, 1953

E. H. HUGENHOLTZ

AUTOMATIC-FREQUENCY CONTROL APPARATUS FOR MAINTAINING A PREDETERMINED-FREQUENCY DIFFERENCE BETWEEN TWO WAVES

Filed Aug. 13, 1948

2,662,181

INVENTOR

EDUARD HERMAN HUGENHOLTZ

BY

Fred M Vogel

AGENT

Patented Dec. 8, 1953

2,662,181

UNITED STATES PATENT OFFICE 2,662,181

AUTOMATIC-FREQUENCY CONTROL APPARATUS FOR MAINTAINING A PREDETERMINED-FREQUENCY DIFFERENCE BETWEEN TWO WAVES

Eduard Herman Hugenholtz, Eindhoven, Netherlands, assignor to Hartford National Bank and Trust Company, Hartford, Conn., as trustee Application August 13, 1948, Serial No. 43,984

Claims priority, application Netherlands September 26, 1947

11 Claims. (Cl. 250—36)

The present invention relates to a device comprising a tunable oscillator which is equipped with means for automatic frequency correction (AFC) for maintaining a preferably variable frequency difference between the frequency of the oscillator voltage and a component of a frequency spectrum given by a control oscillation.

Devices of this kind have already been proposed in prior patent application No. 711,506, filed on December 22, 1946, and issued on December 13, 1951, as Patent No. 2,574,482.

The required AFC control voltage is obtained by comparison of the frequency of the stabilising spectrum component, the desired difference frequency and the frequency of the main oscillator voltage. To this end first of all a spectrum of difference frequencies may, for instance, be produced by mixing the control spectrum and the oscillator voltage, and by subsequently mixing the spectrum of difference frequencies with a voltage exhibiting a frequency corresponding to the frequency difference to be maintained, the AFC control voltage is obtained.

We have found that in circuit-arrangements of the aforesaid kind stabilisation to undesired frequencies and otherwise instability may occur due to undesired combination frequencies produced upon mixing with the frequency spectra, and this more particularly if the frequency of the oscillator voltage, in spite of maintaining the desired frequency difference between this and a component of the control spectrum, falls within the frequency range to be commanded by the control spectrum.

These disadvantages occur more particularly if the frequency of the oscillator voltage is required to be stabilised at will to different components of the control spectrum and the frequency difference between oscillator voltage and stabilising spectrum component is variable so that substantially the whole tuning range of the oscillator commanded in continuous tuning.

In this case this oscillator tuning should be variable over a frequency range corresponding to a frequency range comprising a plurality of components of the control spectrum, so that the oscillator is stabilised in accordance with the chosen oscillator tuning to one of different components (stepwise variable oscillator frequency) the difference in frequency between oscillator voltage and stabilising spectrum component being variable over a frequency range which corresponds to the frequency spacing of successive components of the control spectrum.

Since, as we have found, the said disadvantges are due to the presence of components of the control spectrum other than that required for stabilisation of the oscillator frequency, they might be mitigated by attenuating the components of the spectrum which are undesirable for stabilisation, before supplying the control spectrum to the mixing arrangement or another frequency-comparison circuit-arrangement.

However, the requirements then imposed on pre-selection appear to be so stringent that they cannot be satisfied by means of simple filter-arrangements, particularly not if the oscillator is required to be stabilised at will to different frequency components of the control spectrum in the aforesaid manner and as explained more fully in prior patent application Serial No. 42,496, filed on August 4, 1948 and/or the frequency interval of successive components of the spectrum is small, for instance 1 kc./s. or even less.

According to the invention, in order to avoid these disadvantages in devices comprising a tunable oscillator (hereinafter called main oscillator), which is equipped with AFC means for maintaining a preferably variable frequency difference between the frequency of the main oscillator voltage and a component of the frequency spectrum given by a control oscillation, an auxiliary oscillator is provided, of which the frequency is brought into agreement, by automatic frequency correction, with the frequency of a component of the spectrum, the output voltage of the auxiliary oscillator being supplied as a control oscillation to the AFC means of the main oscillator and these means maintaining the desired frequency difference between the main oscillator frequency and the auxiliary oscillator frequency.

Preferably, the auxiliary oscillator and main oscillator commonly tunable, by single dial tuning, and for maintaining a difference of the tuning frequencies of the frequency-determining circuits of the oscillators which corresponds to the average adjustable frequency difference, the conventional means used in single dial tuning of superheterodyne receiving sets for alignment control of pre-selection and local-oscillator circuits may be used, for instance padding condensers or padding inductances with parallel-trimmer or a low series inductance of variable value.

In order that the invention may be more clearly understood and readily carried into effect it will now be explained more fully with reference to the accompanying drawing, given by way of example, in which corresponding elements bear the same reference numerals.

Figure 1:
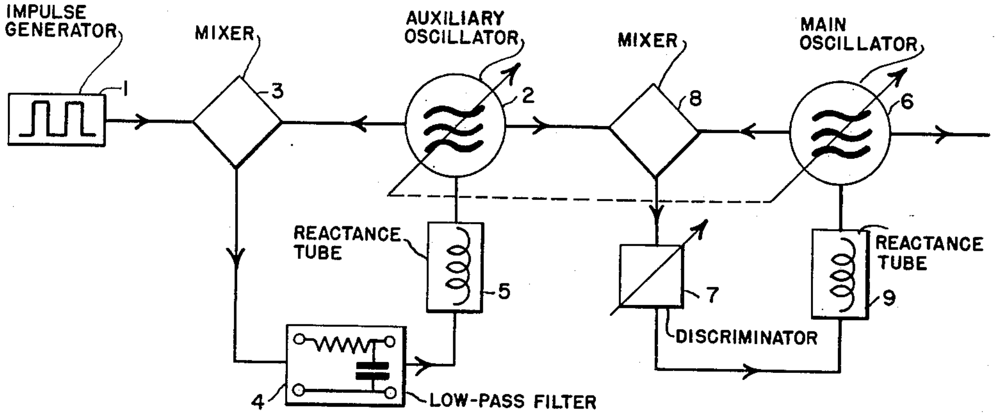
Fig. 1 represents a circuit-arrangement according to the invention, in which the frequency difference to be maintained between the auxiliary- and main-oscillator frequency is determined by a tunable discriminator.

In Fig. 1 a control spectrum is taken from an impulse generator 1, which spectrum serves for stabilising the frequency of the sinusoidal voltage produced by the tunable auxiliary oscillator 2. To this end the output voltage of the impulse generator 1 and that of the auxiliary oscillator 2 are mixed in a mixer stage 3 which may, for instance, be constituted by a hexode mixer tube and of which the output voltage constitutes the AFC-control voltage which controls, through the intermediary of a low-pass filter 4, a frequency corrector 5, for instance a grid-controlled reactance-tube circuit, which is coupled with the frequency determining oscillation-circuit of the auxiliary oscillator 2.

The impulse generator 1 may consist of a multivibrator circuit which is controlled by a quartz crystal generator and by means of which pulses having a duration of approximately 1/50 μsec. and a repeater frequency of 100 kilocycles/sec. and produced. The auxiliary oscillator may be tunable, for instance between 13 megacycles/sec., and 20 megacycles/sec., and the low-pass filter consisting of a single RC-section has a limiting frequency of approximately 35 kilocycles/sec., owing to which, in accordance with the tuning of the auxiliary oscillator, the latter is synchronized to a spectrum component between the 13th and 200th harmonic of the impulse-repeater frequency. Of course, with a smaller frequency spacing of the spectrum components the limiting frequency of the low-pass filter should accordingly be made lower.

With continuous variation of the auxiliary oscillator tuning the frequency of the auxiliary oscillator voltage 5 varies jumpwise from the frequency of one harmonic to that of the next harmonic of the impulse spectrum, so that it is variable between 13 and 20 megacycles/sec. in steps of 100 kilocycles/sec.

In the control spectrum all of the 130th to 200th harmonics are substantially equally represented, but in the output voltage of the auxiliary oscillator substantially only the frequency of the desired stabilising spectrum component occurs and all other spectrum components are greatly attenuated. In the aforesaid very simple construction of the low-pass filter in the AFC-control voltage lead the attenuation factor mounted to approximately 2000 for the strongest undesired components of the spectrum.

Consequently the auxiliary oscillator stabilised by the spectrum may be considered as a very selective filter which mainly passes only the spectrum component required for stabilisation.

The desired spectrum component thus selected is used for stabilising in a manner known per se the frequency of the voltage produced by a main oscillator 6, and between the frequency of auxiliary and main oscillator a difference, for instance of approximately 250 kilocycles/sec. can be maintained, whilst owing to the considerable attenuation of undesired spectrum components, undesired combination frequencies cannot exert a disturbing influence, as might be the case in the absence of the auxiliary oscillator 2.

In Fig. 1 the frequency difference between the auxiliary oscillator 2 and the main oscillator 6 is determined by the tuning of a tuned discriminator 7. The voltages generated by the auxiliary- and main-oscillator are supplied to a mixer stage 8 and the voltage of difference frequency taken therefrom is supplied to the tuned discriminator 7 which may be of a type generally known per se, and supplies a control voltage having a polarity and value which depend upon the sign and value of the difference between the tuning frequency of the discriminator and the difference frequency set up in the output circuit of the mixing stage 8. This control voltage is supplied to a preferably electronic frequency corrector 9 coupled with the main oscillator, for controlling the frequency of the oscillations generated by the main oscillator in such manner as to maintain between this frequency and that of the stabilising spectrum component a frequency difference which corresponds to the tuning frequency of the discriminator.

Similarly to the auxiliary oscillator, the main oscillator is tunable; however, the frequency difference to be maintained between them is to be taken into account.

In order to simplify the tuning of the circuit-arrangement, the tuning means e. g. the tuning condensers of auxiliary- and main-oscillator, may be jointly operated, as is diagrammatically illustrated in the drawing, and for alignment control of the tuning circuits, for instance with equal tuning condensers in conjunction with the frequecy difference to be maintained between both tunings, the means conventional in single dial tuning of superheterodyne receiving sets may be used. For instance, with capacitative tuning of the tuning circuits a variable series- and parallel-capacity (padding condenser and trimmer) may be used in the tuning circuit which is tuned to the highest frequency.

In order to control the frequency difference between auxiliary- and main-oscillator frequency, the discriminator 7 may be tunable, when with alignment control of the tuning circuits of oscillators 2 and 6 the average frequency difference, for instance of 250 kilocycles/sec., can be taken into account.

Figure 2:
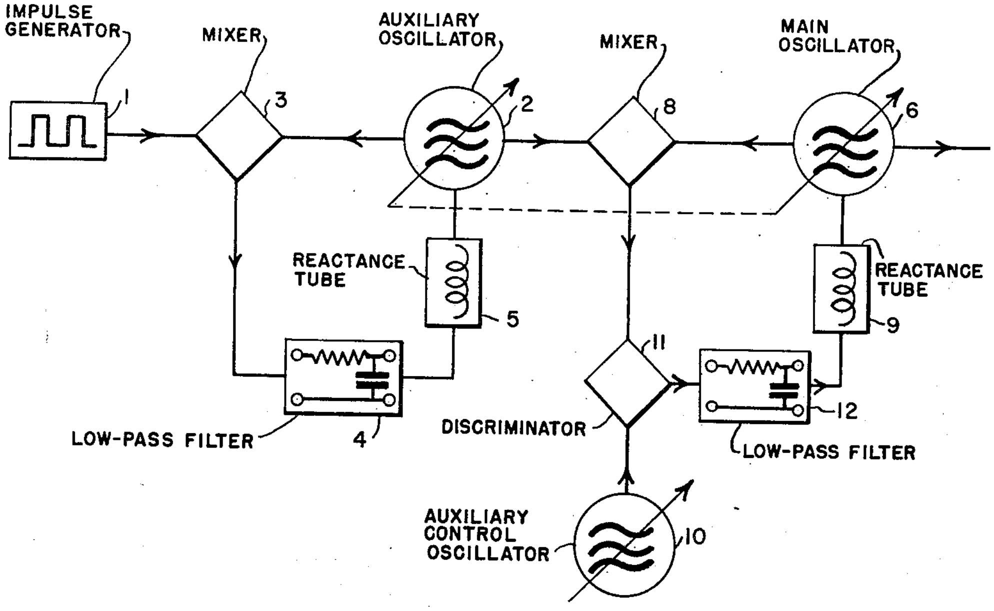
Fig. 2 represents an identical circuit-arrangement in which the frequency difference between the auxiliary-and main-oscillator frequencies is variable by using a tunable auxiliary control-oscillator instead of a tunable discriminator.

To control the frequency difference between auxiliary- and main-oscillator it will generally be cheaper to make use of the circuit shown in Fig. 2, the variable frequency-difference being given by the tuning of an auxiliary control-oscillator 10. In the circuit shown in Fig. 2 the difference-frequency obtained by mixing the auxiliary- and main-oscillator voltage is, supplied for comparison with the frequency given by the auxiliary control oscillator 10, jointly with the latter to a mixing stage 11 which constitutes a so-called heterodyne discriminator and of which the output voltage is supplied as a AFC-control voltage through a low-pass filter 12 to the frequency corrector 9 of the main oscillator 6 which may be constituted by a reactance tube circuit.

If the auxiliary control oscillator is continuously tunable over a frequency range of 100 kilocycles/sec., for instance of 200 to 300 kilocycles/sec. (average frequency difference of 250 kilocycles again) the main oscillator, with a construction and proportioning of the circuit otherwise corresponding to Fig. 1, is adapted to be tuned by single dial tuning between approximately 13, 25 megacycles/sec. and 20.25 megacycles/sec. and subsequently the frequency of the main oscillator 6 in the selected 100 kilocycles/sec. range can be re-adjusted at will by controlling the tuning of the auxiliary control-oscillator.

In this case the stability of the main-oscillator frequency is determined by that of the preferably crystal-controlled impulse generator 1 and that of the auxiliary control-oscillator 10, the latter satisfying comparatively stringent stability requirements owing to the comparatively low tuning frequency.

The aforesaid circuit-arrangements may, if desired, be utilised for so-called decadic building-up of the main oscillator frequency. In this case the auxiliary control oscillator 10, for instance in the circuit shown in Fig. 2, is replaced an oscillator which is stabilised by an impulse generator and which is tunable in steps of 1 kilocycle/sec. over a frequency range of 100 kilocycles/sec. by making use of a stabilising impulse generator having a pulse-repeater frequency of 1 kilocycle/sec.

In the represented circuit-arrangements the main oscillator frequency is stabilised to the auxiliary oscillator frequency by AFC-means operating without inertia. It will be obvious that instead thereof or in combination therewith it is possible to use AFC-means which do not operate without inertia and, for instance, comprise a tuning motor, if this is desirable with a view to maintaining the adjusted main-oscillator frequency upon failure of the control oscillation or in conjunction with the control range of the AFC-means to be commanded.

What I claim is:

1. Apparatus for maintaining a predetermined frequency difference between the frequency of a main oscillator and that of a component in the frequency spectrum yielded by a source of non-sinusoidal reference oscillations, said apparatus comprising a sine-wave generator, a first automatic-frequency-control system effecting synchronism between the frequency of said sine-wave and the frequency of said component and including a voltage-responsive frequency control device operatively coupled to said generator, means coupled to said source and said generator for producing a control voltage depending on the frequency displacement between said sine-wave and the most proximate component in said spectrum and means to apply said control voltage to said device to effect the desired synchronism, and a second automatic-frequency-control system including means coupled to said main oscillator and said generator and responsive to the deviation in the frequency difference therebetween from the predetermined difference for maintaining a frequency difference between the frequency of said main oscillator and the frequency of said sine-wave generator corresponding to said predetermined frequency difference.

2. An arrangement, as set forth in claim 1, wherein said main oscillator and said sine-wave generator are each tunable over a frequency range exceeding the sum of the frequency intervals of a plurality of successive components in the spectrum of said reference oscillations.

3. An arrangement, as set forth in claim 2, further including means for simultaneously tuning said main oscillator and said generator.

4. An arrangement, as set forth in claim 3, wherein said reference source is constituted by a generator producing periodic voltage pulses.

5. Apparatus for maintaining a predetermined frequency difference between the frequency of a main oscillator and that of a component in the frequency spectrum yielded by a source of non-sinusoidal reference oscillations, said apparatus comprising a sine-wave generator, a first automatic-frequency-control system effecting synchronism between the frequency of said sine-wave and the frequency of said component and including a voltage-responsive frequency control device operatively coupled to said generator, means including a mixer coupled to said source and said generator for producing a control voltage depending on the frequency displacement between said sine-wave and the most proximate component in said spectrum and means to apply said control voltage to said device to effect the desired synchronism, and a second automatic-frequency-control system for maintaining a frequency difference corresponding to said predetermined frequency difference between the frequency of said main oscillator and frequency of said sine-wave generator, said second system including a second voltage-responsive frequency control device operatively coupled to said main oscillator, means coupled to said generator and said main oscillator for producing a control potential depending on the deviation in the frequency difference between said main oscillator and said generator from said predetermined frequency difference and means to apply said control potential to said second control device to maintain the desired frequency difference.

6. Apparatus, as set forth in claim 5, wherein said means to produce said control potential includes a mixer coupled to said generator and said main oscillator to produce an intermediate wave whose frequency corresponds to the frequency difference therebetween, and a discriminator coupled to the output of said mixer and tuned to a frequency corresponding to said predetermined frequency difference to produce a control potential depending on the deviation in the frequency of said intermediate wave from said predetermined frequency difference.

7. Apparatus, as set forth in claim 6, wherein said main oscillator, said sine-wave generator, and said discriminator are each tunable.

8. Apparatus for maintaining a predetermined frequency difference between the frequency of the main oscillator and that of a component in the frequency spectrum yielded by a reference source producing periodic voltage pulses, said apparatus comprising a sine-wave generator, a first automatic-frequency-control system effecting synchronism between the frequency of said sine-wave and the frequency of said component and including a voltage-responsive frequency control device operatively coupled to said generator, a mixer coupled to said source and said generator, a low-pass filter coupled to the output of said mixer for deriving therefrom a control voltage depending on the frequency displacement between the sine-wave of said generator and the most proximate component in the frequency spectrum of said source and means to apply said control voltage to said device to effect the desired synchronism, and a second automatic-frequency-control system including means coupled to said main oscillator and said generator and responsive to the deviation in the frequency difference therebetween from said predetermined difference for maintaining a frequency difference between the frequency of said main oscillator and the frequency of said sine-wave generator corresponding to said predetermined frequency difference.

9. An arrangement, as set forth in claim 8, wherein the band-pass of said filter corresponds approximately in width to one half an interval between successive components in said spectrum of said source.

10. Apparatus for maintaining a predetermined frequency difference between the frequency of a main oscillator and that of a component in the frequency spectrum yielded by a source of non-sinusoidal reference oscillations, said apparatus comprising a sine-wave generator, a first automatic-frequency-control system effecting synchronism between the frequency of said sine-wave and the frequency of said component and including a voltage-responsive frequency control device operatively coupled to said generator, means coupled to said source and said generator for producing a control voltage depending on the frequency displacement between said sine-wave and said component and means to apply said control voltage to said device to effect the desired synchronism, and a second automatic-frequency-control system for maintaining a frequency difference corresponding to said predetermined frequency difference between the frequency of said main oscillator and the frequency of said sine-wave generator, said second system including an auxiliary oscillator tuned to a frequency corresponding to said predetermined frequency difference, a mixer coupled to said generator and said main oscillator to produce an intermediate wave whose frequency corresponds to the frequency difference therebetween, a heterodyne discriminator coupled to the output of said mixer and said auxiliary oscillator to produce a control potential depending on the frequency difference therebetween, a second voltage-responsive control device operatively coupled to said main oscillator, and means to apply said control potential to said second device to maintain the desired frequency difference between said main oscillator and said generator.

11. An arrangement, as set forth in claim 10, wherein said sine-wave generator, said auxiliary oscillator and said main oscillator are each tunable, and including means wherein said generator and said main oscillator are ganged together to effect single dial tuning thereof.

EDUARD HERMAN HUGENHOLTZ.

References Cited in the file of this patent

UNITED STATES PATENTS

| Number | Name | Date |
|---|---|---|
| 2,206,695 | Guanella | July 2, 1940 |
| 2,406,125 | Ziegler et al. | Aug. 20, 1946 |
| 2,447,098 | Silverman | Aug. 17, 1948 |
| 2,460,112 | Wright et al. | Jan. 25, 1949 |
| 2,521,070 | Lindner et al. | Sept. 5, 1950 |
| 2,605,425 | Hugenholtz | July 29, 1952 |